United States Patent
Yoshihara et al.

(10) Patent No.: US 7,061,219 B2
(45) Date of Patent: Jun. 13, 2006

(54) INDEPENDENT MEASUREMENT OF COMPLICATED TRANSFER FUNCTIONS

(75) Inventors: Koichi Yoshihara, Tokyo (JP); Kenichi Miyake, Saitama (JP); Yoneo Akita, Tokyo (JP)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 11/132,460

(22) Filed: May 18, 2005

(65) Prior Publication Data

US 2005/0275395 A1    Dec. 15, 2005

(30) Foreign Application Priority Data

May 28, 2004    (JP)    ............... 2004-159797

(51) Int. Cl.
*G01R 27/02*    (2006.01)
*G01R 27/28*    (2006.01)

(52) U.S. Cl. ............ 324/76.12; 324/615; 702/109

(58) Field of Classification Search ............ 324/76.12, 324/615; 702/109
See application file for complete search history.

(56) References Cited

U.S. PATENT DOCUMENTS

| | | | | |
|---|---|---|---|---|
| 3,973,112 A | * | 8/1976 | Sloane | ............ 324/76.21 |
| 4,713,782 A | * | 12/1987 | Blackham | ............ 702/109 |
| 5,175,698 A | * | 12/1992 | Barbanell | ............ 324/615 |
| 6,232,760 B1 | * | 5/2001 | Eckert | ............ 324/615 |
| 6,526,365 B1 | | 2/2003 | Marino et al. | |
| 6,529,012 B1 | * | 3/2003 | Boss et al. | ............ 324/615 |

* cited by examiner

*Primary Examiner*—Anjan Deb
*Assistant Examiner*—Timothy J. Dole
(74) *Attorney, Agent, or Firm*—Francis I. Gray

(57) ABSTRACT

A first test signal from a test signal source is provided to a spectrum analyzer to produce first measurement data. The test signal source is expressed by a first transfer function $G(w)$ and the spectrum analyzer is expressed by second transfer function $F(w)$. A second test signal is provided to the spectrum analyzer to produce second measurement data where the second test signal is derived from the first test signal by shifting the frequency by a known increment. From the first and second measurement data, the components are the same on $G(w)$ but different on $F(w)$. The $G(w)$ components are cancelled by calculation using the first and second measurement data and then the second transfer function $F(w)$ is evaluated independently of $G(w)$.

10 Claims, 3 Drawing Sheets

INDEPENDENT MEASUREMENT OF COMPLICATED TRANSFER FUNCTIONS

BACKGROUND OF THE INVENTION

The present invention relates to measuring a transfer function of a device, and more particularly to measuring the transfer function of a frequency analyzer independently from a transfer function for a test signal source.

A network analyzer is used to measure frequency transfer functions of various circuits, such as filters, amplifiers, etc., by using two factors—amplitude and phase. However, it is very difficult for the network analyzer to measure the frequency transfer function of a spectrum analyzer since the spectrum analyzer has down converters that make the measurement complicated.

Previously for measuring complicated transfer functions a first method provides an apparatus under test with a continuous wave (CW) signal as an input having known characteristics (amplitude and phase). A second method measures input and output signals of the apparatus under test to determine the characteristics, the input signal being a known continuous wave (CW) signal that changes in frequency. The second method omits the measurement of phase because the phase change is negligible when the bandwidth is narrow enough.

If a wide bandwidth signal is used for measuring transfer functions, a known modulation signal in place of the CW signal is input to the apparatus under test, and then the input and output signals are measured to determine the transfer function by supposing the known modulation signal is ideal, as shown in U.S. Pat. No. 6,526,365.

As indicated above, the network analyzer is not suitable for measuring the transfer function of a complex apparatus, such as a spectrum analyzer having down converters. The measurement method using a CW signal requires special measurement instruments and cannot measure a phase characteristic. The measurement method using a known modulation signal is not realistic because the method requires an ideal modulation signal source. Also the output signal of the apparatus under test includes a combination of the transfer function G(w) of the signal source and the transfer function F(w) of the apparatus under test. Therefore it is necessary to evaluate the transfer functions G(w) and F(w) independently to determine the transfer function F(w). Even if the test signal is measured by the spectrum analyzer, the result includes the combination of the transfer functions of the spectrum analyzer and the signal source so that this method requires the transfer function of the spectrum analyzer to be accurately measured in advance.

What is desired is a method of measuring the transfer function of a complex apparatus, such as a spectrum analyzer, independently of the transfer function of a test signal source.

BRIEF SUMMARY OF THE INVENTION

Accordingly the present invention provides a method of measuring the transfer function of a spectrum analyzer independently of the transfer function of a test signal source. The test signal source provides two different test signals to the spectrum analyzer to produce two sets of measurement data, one test signal being derived from the other test signal by shifting the frequency of the other test signal by a given frequency increment. The two sets of measurement data are combinations of the components of the transfer functions for the spectrum analyzer and the test signal source at each frequency bin. Referring to the corresponding data between the two sets of measurement data, the components of one transfer function are the same in the two sets of measurement data, but those of the other transfer function are different since the frequencies of the test signals are different by the known frequency increment. The components of the one transfer function in the calculation are canceled using the two sets of measurement data to evaluate the other transfer function independently. As a result the true transfer function of the spectrum analyzer is obtained, making it possible to optimally adjust the characteristics of the spectrum analyzer. Once the spectrum analyzer transfer function is evaluated, then the test signal source transfer function may be evaluated.

The objects, advantages and other novel features of the present invention are apparent from the following detailed description when read in conjunction with the appended claims and attached drawing.

DETAILED DESCRIPTION OF THE INVENTION

Figure 1:
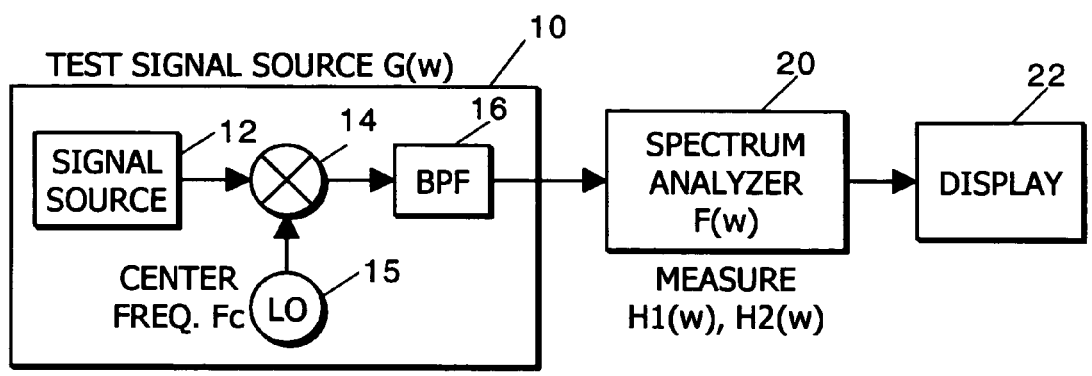
FIG. 1 is a block diagram view of a system suitable of independently measuring the transfer function of a spectrum analyzer according to the present invention.

Referring now to FIG. 1, a test signal source 10 has characteristics indicated by a transfer function G(w), called for the purpose of explanation of the invention the "first transfer function." A signal source 12 provides a known test signal to a mixer 14. The signal source 12 provides, for example, an OFDM (Orthogonal Frequency Division Multiplexing) signal that is derived by converting digital data into analog signals and modulating the analog signals by a plurality of signals of different frequencies. The OFDM signal is desirable because it has flat characteristics in the frequency domain. The mixer 14 mixes the test signal with a desired center frequency signal Fc from an oscillator 15. A band pass filter (BPF) 16 selectively outputs a signal having desired frequencies. This process provides a desired frequency shift to the test signal, as is well known. Although not shown, the test signal test signal source 10 may include an input device (keyboard, etc.) and a control device (microprocessor, etc.), and the center frequency may be changed to any desired one.

If the test signal is derived only from the signal source 12, the transfer function of the test signal is known since it is derived from the digital data. However, the test signal source 10 requires not only the signal source 12 but also other peripheral circuits (not shown). A frequency shifter as described below is used so that the first transfer function G(w) of the test signal source 10 may be determined to some extent, but not accurately.

The test signal from the test signal source 10 is input to a spectrum analyzer 20 that measures frequency characteristics of the input signal and indicates the results on a display 22. The spectrum analyzer 20 may have a fast digital calculation circuit, such as a DSP (Digital Signal Processor), to conduct necessary fast calculations for frequency analysis, such as FFT (Fast Fourier transform) calculations.

The spectrum analyzer 20 is an apparatus for measuring frequency so that it is ideal to have flat transfer functions for various frequencies, amplitudes and phases. However, it is very difficult to have the ideal transfer functions because there are multiple filters and down converters in the spectrum analyzer 20. To get closer to the ideal, the accurate transfer function of the spectrum analyzer needs to be determined to adjust the characteristics of the circuits. The transfer function F(w) of the spectrum analyzer 20 is called the "second transfer function" hereafter. The spectrum analyzer 20 is an apparatus under test as well as a measurement apparatus.

The spectrum analyzer 20 handles the input signal using digital processes so that the resultant digital frequency domain data are produced for every know frequency interval $\Delta w$. The place where the digital frequency data is located is called a "bin". If the frequency bins at every $\Delta w$ are $w_0, w_1, w_2 \ldots$, the above transfer functions may be denoted by $G(w_0), G(w_1), G(w_2), \ldots, F(w_0), F(w_1), F(w_2), \ldots$ For simplicity of the expressions, they are described by $g_0, g_1, g_2, \ldots, f_0, f_1, f_2, \ldots$ respectively hereafter.

Figure 2:
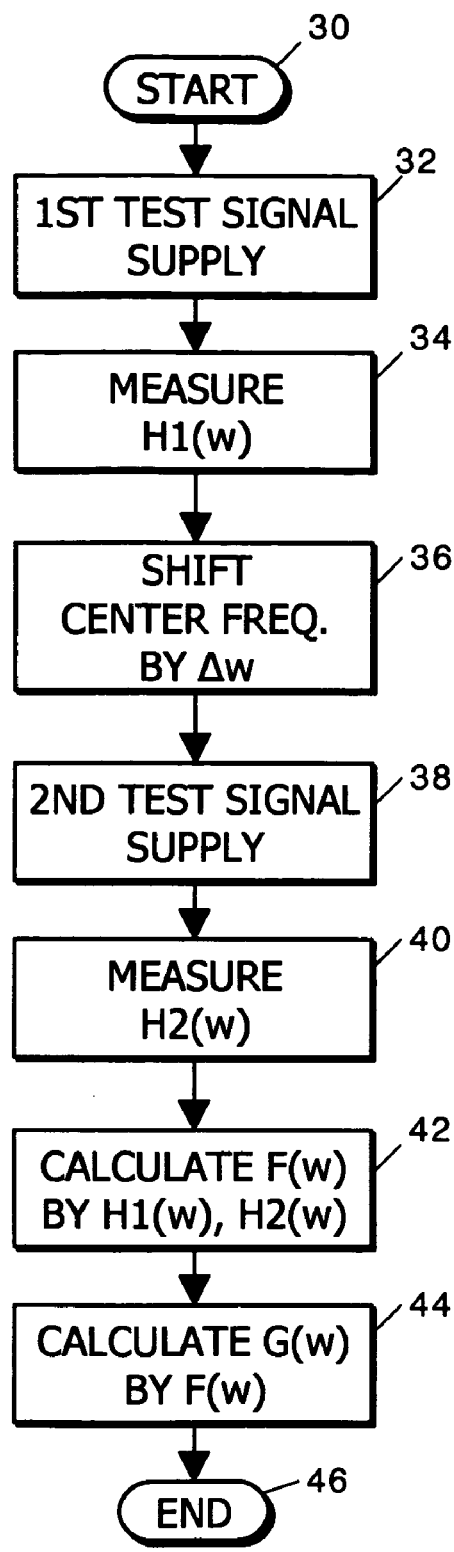
FIG. 2 is a flowchart view of the measurement method according to the present invention.

Referring to FIG. 2, the test signal source 10 provides first and second test signals (steps 32 and 38). The spectrum analyzer 20 measures these test signals to determine the transfer functions (steps 34 and 40). The measured data are denoted by transfer functions combining the components of the first and second transfer functions G(w) and F(w). The spectrum analyzer 20 measures two transfer functions H1(w) and H2(w) in the following manner. H1(w) has products between the component "bins" of G(w) and F(w) without a frequency difference, as denoted by the following equation 1.

$$H1(w) = g_0{}^*f_0, g_1{}^*f_1, g_2{}^*f_2, \ldots, g_n{}^*f_n \quad (1)$$

On the other hand, H2(w) is measured by providing the spectrum analyzer 20 with the second test signal that is produced by shifting the center frequency of G(w) and thus the bins by $\Delta w$ so that the bins of H2(w) are denoted by the following equation 2.

$$H2(w) = g_0{}^*f_1, g_1{}^*f_2, g_2{}^*f_3, \ldots, g_n{}^*f_{n+1} \quad (2)$$

Figure 3:
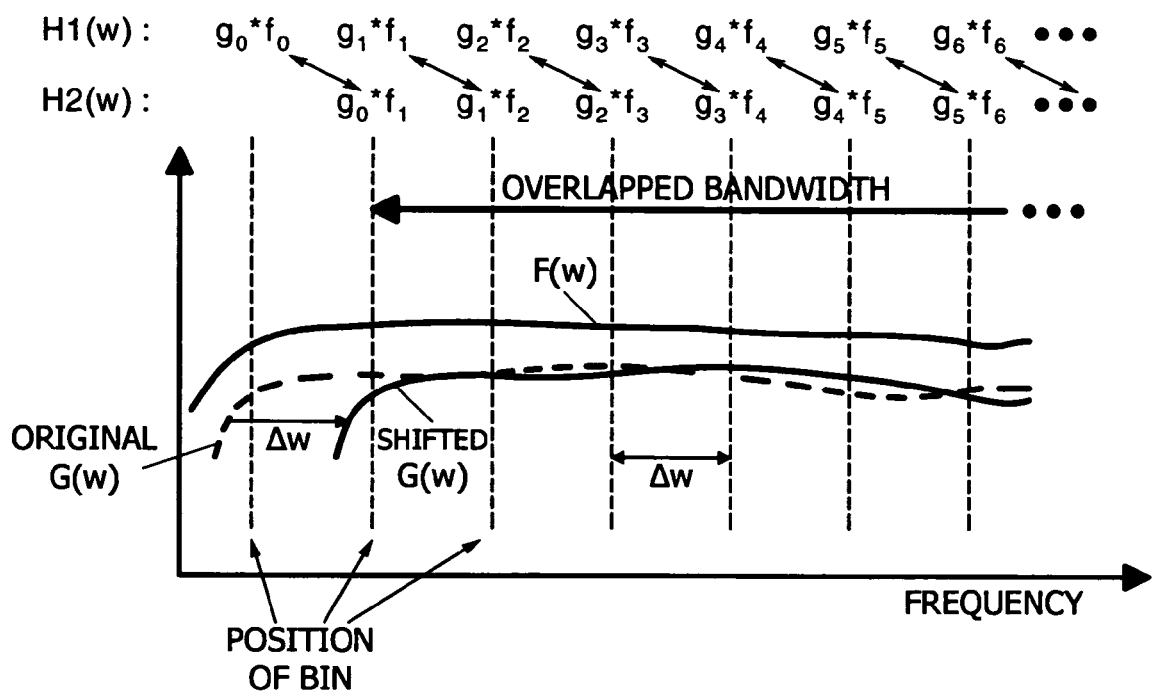
FIG. 3 is a conceptual graphic view showing a relationship of device transfer functions G(w) and F(w), and combination transfer functions H1(w) and H2(w) according to the present invention.

Referring to FIG. 3, the data of the bins of H1(w) are divided by the corresponding data of the bins of H2(w) to cancel the components of G(w) so that the components of F(w) are independently determinable, and then the following equation 3 is obtained.

$$H1(w)/H2(w) = g_0^*f_0/g_0^*f_1, g_1^*f_1/g_1^*f_2,$$
$$g_2^*f_2/g_2^*f_3, \ldots, g_n^*f_n/g_n^*f_{n+1}$$
$$= f_0/f_1, f_1/f_2, f_2/f_3, \ldots, f_n/f_{n+1} \quad (3)$$

The terms of equation 3 show ratios of the data so that they may be replaced by complex ratios as shown by the following equation 4.

$$r_0 = f_0/f_1, r_1 = f_1/f_2, r_2 = f_2/f_3, \ldots, r_n = f_n/f_{n+1} \quad (4)$$

With $f_0 = 1$ for normalization the bins of F(w) are denoted by the following equation 5.

$$f_0 = 1, f_1 = 1/r_0, f_2 = 1/(r_0{}^*r_1), f_3 = 1/(r_0{}^*r_1{}^*r_2), \ldots,$$
$$f_{n+1} = 1/(r_0{}^*r_1{}^*r_2{}^* \ldots {}^*r_n) \quad (5)$$

Equation 5 has only the components of F(w), which means that F(w) is evaluated independently of G(w). Once F(w) is evaluated, then G(w) may also be evaluated by using H1(w) or H2(w) with F(w) independently of G(w) as shown in step 44. The first and second measured data of the components of the first transfer function G(w) are the same, so that they are cancelled, but the first and second measured data of the components of the second transfer function F(w) have a known frequency difference.

As described above, the frequency of a test signal is shifted by a known frequency and then two transfer functions G(w) and F(w) are independently evaluated. In the above embodiment, the spectrum analyzer 20 and the test signal source 10 are described as separate blocks. The test signal source 10, however, may be located in the spectrum analyzer 20, which eliminates the need to bring the spectrum analyzer to some place to measure the characteristics by a CW signal in order to evaluate the transfer functions or conduct the calibration.

The present invention has been described according to a suitable embodiment but it would be apparent for those skilled in the art to modify it without departing from the scope of the present invention. For example, G(w) is shifted by $\Delta w$ for evaluating H2(w), the frequency shift may be $k\Delta w$ (k is a natural number) where k may be a large number as long as the bandwidths of F(w) and G(w) overlap.

The present invention measures the transfer function of a spectrum analyzer, which makes it possible to calibrate the transfer function to be ideal by using the measured transfer function. In the above embodiment, the spectrum analyzer 20 is an apparatus under test as well as a measurement apparatus. However, the spectrum analyzer after calibration with the known transfer function may be used for calibrating other apparatus or circuits under test, i.e., the present invention makes it possible to measure and calibrate a wide bandwidth filter by using a modulation signal.

What is claimed is:

1. A method of measuring a complex transfer function of an apparatus under test comprising the steps of:
   providing a first test signal at a first frequency from a test signal source expressed by a source transfer function to the apparatus under test expressed by the complex transfer function to produce first measurement data from the apparatus under test;
   providing a second test signal at a second frequency from the test signal source to the apparatus under test to produce second measurement data wherein the second frequency is derived from the first frequency by shifting the first frequency by a known increment; and
   evaluating the complex transfer function independently of the source transfer function by canceling the components of the source transfer function in a calculation using the first and second measurement data.

2. The method as recited in claim 1 wherein the evaluating step comprises the step of dividing the components of the first measurement data by the corresponding components of the second measurement data.

3. The method as recited in claim 1 further comprising the step of evaluating the source transfer function independently of the complex transfer function by using one of the first and second measurement data with the complex transfer function from the complex transfer function evaluating step.

4. The method as recited in claim 1 further comprising the steps of:
   generating the components of the source and complex transfer functions for a plurality of frequency bins having a known frequency interval between frequency bins; and deriving the second frequency from the first frequency by shifting the first frequency by an integer multiple of the known frequency interval.

5. A method as recited in claim 1 wherein the test signals comprise an OFDM signal.

6. A system for independently measuring a complex transfer function of an apparatus under test comprising:
   a test signal generator expressed as a source transfer function for providing first and second test signals at first and second frequencies to the apparatus under test to produce first and second measurement data respectively, wherein the second frequency is derived from the first frequency by shifting the first frequency by a given frequency interval; and
   means for evaluating the complex transfer function by canceling the components of the source transfer function in a calculation using the first and second measurement data.

7. The system as recited in claim 6 wherein the components of the first measurement data are divided by the corresponding components of the second measurement data to evaluate the complex transfer.

8. The system as recited in claim 6 wherein the source transfer function is evaluated by using one of the first and second measurement data with the evaluated complex transfer function.

9. The system as recited in claim 6 wherein the components of the source and complex transfer functions are generated for a plurality of frequency bins having a given frequency interval and the second frequency is derived from the first frequency by shifting the first frequency by an integer multiple of the given frequency interval.

10. The system as recited in claim 6 wherein the test signals comprise an OFDM signal.

* * * * *